United States Patent
Lew et al.

(10) Patent No.: US 11,396,715 B2
(45) Date of Patent: Jul. 26, 2022

(54) NITROGEN CONTAINING SINGLE CRYSTAL DIAMOND MATERIALS OPTIMIZED FOR MAGNETOMETRY APPLICATIONS

(71) Applicants: ELEMENT SIX TECHNOLOGIES LIMITED, Didcot (GB); ELEMENT SIX TECHNOLOGIES US CORPORATION, Santa Clara, CA (US)

(72) Inventors: Wilbur Lew, Mount Laurel, NJ (US); Gregory Bruce, Abington, PA (US); Andrew Mark Edmonds, Didcot (GB); Matthew Lee Markham, Didcot (GB); Alastair Douglas Stacey, Didcot (GB); Harpreet Kaur Dhillon, Didcot (GB)

(73) Assignees: Element Six Technologies Limited, Didcot (GB); Element Six Technologies US Corporation, Santa Clara, CA (US)

( * ) Notice: Subject to any disclaimer, the term of this patent is extended or adjusted under 35 U.S.C. 154(b) by 457 days.

(21) Appl. No.: 16/065,526

(22) PCT Filed: Dec. 6, 2016

(86) PCT No.: PCT/US2016/065091
§ 371 (c)(1),
(2) Date: Jun. 22, 2018

(87) PCT Pub. No.: WO2017/112399
PCT Pub. Date: Jun. 29, 2017

(65) Prior Publication Data
US 2021/0054526 A1 Feb. 25, 2021

(30) Foreign Application Priority Data
Dec. 22, 2015 (GB) ..................... 1522650

(51) Int. Cl.
*C30B 29/04* (2006.01)
*C30B 25/02* (2006.01)
(Continued)

(52) U.S. Cl.
CPC .............. *C30B 29/04* (2013.01); *C30B 25/02* (2013.01); *C30B 30/04* (2013.01); *C30B 31/20* (2013.01); *C30B 33/04* (2013.01)

(58) Field of Classification Search
CPC ......... C30B 29/04; C30B 25/02; C30B 33/04; C30B 30/04; C30B 31/20
(Continued)

(56) References Cited

U.S. PATENT DOCUMENTS 10,324,142 B2  6/2019  Hatano et al.
2014/0061510 A1  3/2014  Twitchen et al.
(Continued)

FOREIGN PATENT DOCUMENTS

CN  102575380 A  7/2012
GB  2490589 A  11/2012
(Continued)

OTHER PUBLICATIONS

Acosta, V. M., et al., "High nitrogen-vacancy density diamonds for magnetometry applications," Physical Review B, Apr. 11, 2009, pp. 115202-1-115202-21, vol. 80, American Physical Society.
(Continued)

*Primary Examiner* — Kiet T Nguyen
(74) *Attorney, Agent, or Firm* — Kilpatrick Townsend & Stockton LLP

(57) ABSTRACT

A single crystal diamond material comprising: neutral nitrogen-vacancy defects ($NV^0$); negatively charged nitrogen-vacancy defects ($NV^-$); and single substitutional nitrogen defects ($N_s$) which transfer their charge to the neutral nitrogen-vacancy defects ($NV^0$) to convert them into the
(Continued)

negatively charged nitrogen-vacancy defects (NV), characterized in that the single crystal diamond material has a magnetometry figure of merit (FOM) of at least 2, wherein the magnetometry figure of merit is defined by (I) where R is a ratio of concentrations of negatively charged nitrogen-vacancy defects to neutral nitrogen-vacancy defects ($[NV^-]/[NV^0]$), $[NV^-]$ is the concentration of negatively charged nitrogen-vacancy defects measured in parts-per-million (ppm) atoms of the single crystal diamond material, [NV0] is a concentration of neutral nitrogen-vacancy defects measured in parts-per-million (ppm) atoms of the single crystal diamond material, and $T_2'$ is a decoherence time of the $NV^-$ defects, where $T_2'$ is $T_2^*$ for DC magnetometry or $T_2$ for AC magnetometry.

9 Claims, 2 Drawing Sheets

(51) Int. Cl.
  *C30B 33/04* (2006.01)
  *C30B 31/20* (2006.01)
  *C30B 30/04* (2006.01)
(58) Field of Classification Search
  USPC .......................................................... 423/446
  See application file for complete search history.

(56) References Cited

U.S. PATENT DOCUMENTS

| | | | |
|---|---|---|---|
| 2014/0065424 A1 | 3/2014 | Boudou et al. | |
| 2014/0291490 A1* | 10/2014 | Hanson | G02B 6/00 250/214 R |
| 2015/0253355 A1* | 9/2015 | Grinolds | G01N 21/645 850/40 |

FOREIGN PATENT DOCUMENTS

| | | |
|---|---|---|
| GB | 2492822 A | 1/2013 |
| GB | 2497660 A | 6/2013 |
| WO | 2010010344 A1 | 1/2010 |
| WO | 2010010352 A1 | 1/2010 |
| WO | 2010149775 A1 | 12/2010 |
| WO | 2015107907 A1 | 3/2017 |

OTHER PUBLICATIONS

Edmonds, A. M., et al., "Production of oriented nitrogen-vacancy color centers in synthetic diamond," Physical Review B, Condensed Matter and Materials Physics, Jul. 1, 2012, pp. 035201-1-035201-7, vol. 86, No. 3, American Physical Society.
Stanwix, P. L., et al., "Coherence of Nitrogen-Vacancy Electronic Spin Ensembles in Diamond," Jun. 22, 2010, pp. 1-5, XP080484737, Arxiv.org, Cornell University Library, Ithaca, NY.
International Patent Application No. PCT/US2016/065091, International Search Report and Written Opinion dated Mar. 20, 2017, 17 pages.
United Kingdom Patent Application No. GB1522650.9, Search Report dated Aug. 22, 2016, 4 pages.
Davies, Gordon, "Current problems in diamond: towards a quantitative understanding," Physica B, 1999, pp. 15-23, vol. 273-274, Elsevier Science B.V.
Khan, R. U. A., et al., "Charge transfer effects, thermo-and photochromism in single crystal CVD synthetic diamond," Journal of Physics: Condensed Matter, Aug. 19, 2009, p. 364214, vol. 21, No. 36, IOP Publishing Ltd.
International Patent Application No. PCT/US2016/065091, International Preliminary Reporton Patentability dated Jul. 5, 2018, 8 pages.

\* cited by examiner

NITROGEN CONTAINING SINGLE CRYSTAL DIAMOND MATERIALS OPTIMIZED FOR MAGNETOMETRY APPLICATIONS

FIELD OF INVENTION

Embodiments of the present invention are directed to nitrogen containing single crystal diamond materials optimized for magnetometry applications. It is also envisaged that while the single crystal diamond materials described herein have been optimized for magnetometry applications, the materials are also suitable for other applications which utilize negatively charged nitrogen-vacancy defects within a diamond lattice.

BACKGROUND

Point defects in synthetic diamond material, particularly quantum spin defects and/or optically active defects, have been proposed for use in various imaging, sensing, and processing applications including: luminescent tags; magnetometers; spin resonance devices such as nuclear magnetic resonance (NMR) and electron spin resonance (ESR) devices; spin resonance imaging devices for magnetic resonance imaging (MRI); quantum information processing devices such as for quantum communication and computing; magnetic communication devices; and gyroscopes for example.

It has been found that certain defects are particularly useful for sensing and quantum processing applications when in their negative charge state. For example, the negatively charged nitrogen-vacancy defect (NV$^-$) in synthetic diamond material has attracted a lot of interest as a useful quantum spin defect because it has several desirable features including:

(i) Its electron spin states can be coherently manipulated with high fidelity and have an extremely long coherence time (which may be quantified and compared using the transverse relaxation time $T_2$ and/or $T_2^*$);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy, and imaging. Furthermore, it is a key ingredient towards using NV$^-$ defects as qubits for long-distance quantum communications and scalable quantum computation. Such results make the NV$^-$ defect a competitive candidate for solid-state quantum information processing (QIP).

The NV$^-$ defect in diamond consists of a substitutional nitrogen atom adjacent to a carbon vacancy. Its two unpaired electrons form a spin triplet in the electronic ground state ($^3$A), the degenerate $m_s=\pm 1$ sublevels being separated from the $m_s=0$ level by 2.87 GHz. The electronic structure of the NV$^-$ defect is such that the $m_s=0$ sublevel exhibits a high fluorescence rate when optically pumped. In contrast, when the defect is excited in the $m_s=\pm 1$ levels, it exhibits a higher probability to cross over to the non-radiative singlet state ($^1$A) followed by a subsequent relaxation into $m_s=0$. As a result, the spin state can be optically read out, the $m_s=0$ state being "bright" and the $m_s=\pm 1$ states being dark. When an external magnetic field or strain field is applied, the degeneracy of the spin sublevels $m_s=\pm 1$ is broken via Zeeman splitting. This causes the resonance lines to split depending on the applied magnetic/strain field magnitude and its direction. This dependency can be used for magnetometry by probing the resonant spin transitions using microwaves (MW) and using optically detected magnetic resonance (ODMR) spectroscopy to measure the magnitude and, optionally, the direction of the applied magnetic field.

NV$^-$ defects in synthetic diamond material can be formed in a number of different ways including:

(i) formation during growth of the synthetic diamond material where a nitrogen atom and a vacancy are incorporated into the crystal lattice as a nitrogen-vacancy pair during growth;

(ii) formation after diamond material synthesis from native nitrogen and vacancy defects incorporated during the growth process by post-growth annealing the material at a temperature (around 800° C.) which causes migration of the vacancy defects through the crystal lattice to pair up with native single substitutional nitrogen defects;

(iii) formation after diamond material synthesis from native nitrogen defects incorporated during the growth process by irradiating the synthetic diamond material to introduce vacancy defects and then subsequently annealing the material at a temperature which causes migration of the vacancy defects through the crystal lattice to pair up with native single substitutional nitrogen defects;

(iv) formation after diamond material synthesis by implanting nitrogen defects into the synthetic diamond material after diamond material synthesis and then annealing the material at a temperature which causes migration of the native vacancy defects through the crystal lattice to pair up with implanted single substitutional nitrogen defects; and (v) formation after diamond material synthesis by irradiating the synthetic diamond material to introduce vacancy defects, implanting nitrogen defects into the synthetic diamond material before or after irradiation, and annealing the material at a temperature which causes migration of the vacancy defects through the crystal lattice to pair up with implanted single substitutional nitrogen defects.

Various different types of diamond material have been disclosed in the prior art for use in various different types of magnetometry applications including:

Acosta et al., *Phys. Rev. B* 80, 115202 which discusses the properties of high pressure high temperature (HPHT) diamond materials for magnetometry applications;

WO2010/010352 and WO2010/010344 which disclose low nitrogen content single crystal chemical vapour deposited (CVD) diamond materials for applications such as magnetometry; and WO2010/149775 which discloses irradiated and annealed single crystal CVD diamond materials for applications such as magnetometry.

While various types of diamond material have been proposed for magnetometry applications, it is an aim of embodiments of the present invention to optimize the material-related aspects of a diamond-based magnetometer and provide suitable fabrication methodology to achieve such optimized diamond material characteristics.

SUMMARY OF INVENTION

According to a first aspect of the present invention there is provided a single crystal diamond material comprising:
neutral nitrogen-vacancy defects (NV⁰);
negatively charged nitrogen-vacancy defects (NV⁻); and
single substitutional nitrogen defects (N$_s$) which transfer their charge to the neutral nitrogen-vacancy defects (NV⁰) to convert them into the negatively charged nitrogen-vacancy defects (NV⁻),
characterized in that the single crystal diamond material has a magnetometry figure of merit (FOM) of at least 2, wherein the magnetometry figure of merit is defined by $$FOM = \mathcal{R}\sqrt{[NV^-] \times T_2'}$$

where $\mathcal{R}$ is a ratio of concentrations of negatively charged nitrogen-vacancy defects to neutral nitrogen-vacancy defects ([NV⁻]/[NV⁰], [NV⁻] is the concentration of negatively charged nitrogen-vacancy defects measured in parts-per-million (ppm) atoms of the single crystal diamond material, [NV⁰] is a concentration of neutral nitrogen-vacancy defects measured in parts-per-million (ppm) atoms of the single crystal diamond material, and $T_2'$ is a decoherence time of the NV⁻ defects in microseconds (μs), where $T_2'$ is $T_2^*$ for DC magnetometry or $T_2$ for AC magnetometry.

According to a second aspect of the present invention there is provided a magnetometer comprising the single crystal diamond material of the first aspect of the invention.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
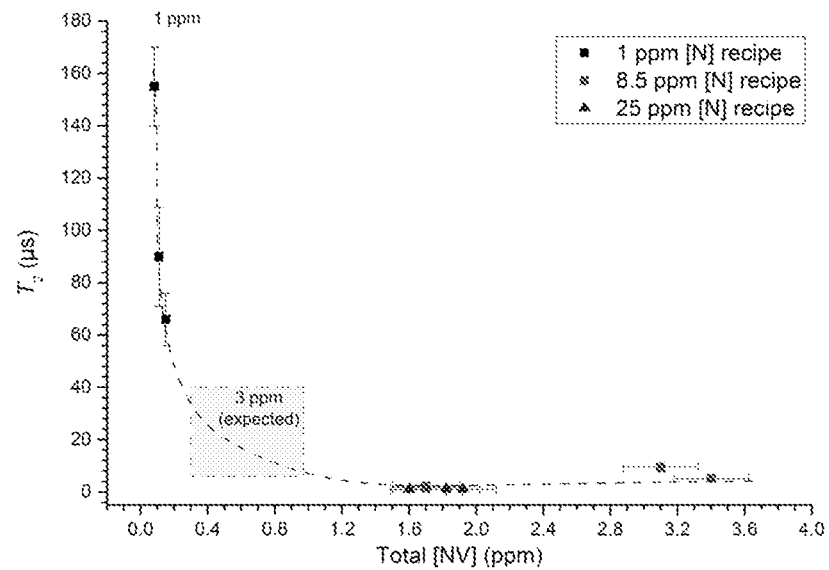
FIG. 1 is a graph of decoherence time $T_2$ as a function of total [NV] for a range of single crystal diamond materials.

The shot-noise limit of a NV⁻ based magnetic sensor is commonly written in the following form:

$$\delta B_{min} = \frac{\hbar}{g_e \mu_B} \frac{1}{\alpha\sqrt{\eta}} \frac{1}{\sqrt{n_{NV} T_2' t_m}} \quad (1)$$

where $\delta B_{min}$ is the minimum detectable change in a magnetic (B) field (in a measurement time $t_m$), $g_e$ is the Lande g factor, $\mu_B$ is the Bohr magneton, $\alpha$ is the contrast, $\eta$ is the photon-collection efficiency, $n_{NV}$ is the number of NV centres being excited and $T_2'$ is the appropriate spin-spin coherence time. In the case of DC-based magnetometry $T_2'$ should be set to the inhomogeneous spin-spin relaxation time, $T_2^*$, whereas $T_2$ is the relevant dephasing time in the case of AC-based schemes. These so-called relaxation, dephasing, or decoherence time parameters ($T_2^*$ and $T_2$) are known to those in the art. Magnetic field sensitivity of a diamond based magnetometer may also be expressed in the following form:

$$\delta B_{min}\sqrt{t_m} = \frac{\hbar}{g_e \mu_B} \frac{1}{\alpha\sqrt{\eta}} \frac{1}{\sqrt{n_{NV} T_2'}} \quad (2)$$

hence the frequently used units of T/√Hz (typically in nanotesla (nT) or picotesla (pT)).

This expression highlights the key parameters which influence the achievable sensitivity of a NV⁻ based device. The device comprises the synthesized NV⁻ containing diamond as well as the excitation laser/LED (of chosen power, wavelength, focus-spot size etc), microwave excitation setup, and luminescence-collecting optics.

The present invention is concerned with optimizing the material-related aspects of a diamond-based magnetometer and hence it is helpful to identify the properties of the material which affect the terms in equation 2. Assuming a constant fraction of NV centres are able to be excited (and their optical emission detected) $n_{NV}$ is proportional to the concentration of negatively charged NV⁻ defects [NV⁻].

The presence of the neutral NV centre in a sample ([NV⁰]) is detrimental to device sensitivity for two reasons. Firstly, it is paramagnetic and hence may limit the value of $T_2^*/T_2$. Secondly, the emission spectrum of NV⁰ partly overlaps with the phonon sideband of the NV⁻ defect. This leads to background luminescence which reduces the contrast (α). Therefore the ratio of [NV⁻]/[NV⁰], henceforth referred to as $\mathcal{R}$, is a material-based term in α. Combining these terms and using equation 2 yields a material figure of merit (FOM) for diamond based magnetometry applications:

$$FOM = \mathcal{R}\sqrt{[NV^-] \times T_2'} \quad (3)$$

Optimizing production of NV⁻ containing diamond against this FOM presents a challenge in that $\mathcal{R}$, $T_2'$, and [NV⁻] are interrelated. Maximizing [NV⁻] could be achieved by use of high-[N] containing diamond material (either HPHT or CVD) which is then treated with a high irradiation dose (commonly by electron irradiation) and annealed. However, as the conversion fraction of starting [N] to final [NV] increases, the value of $\mathcal{R}$ decreases. This is because residual [N] acts an electron donor for NV defects and hence leads to an NV⁰→NV⁻ charge state conversion. If a large fraction of N is converted to NV then there is insufficient N to act as a charge donor to convert NV⁰ to NV⁻. In contrast, if a high concentration of residual nitrogen [N] is retained, then the residual nitrogen causes dephasing of the NV⁻ leading to a reduction in $T_2^*$.

The development of a production methodology for diamond where there is a high degree of independence of $\mathcal{R}$, $T_2'$ and [NV⁻] would solve a key problem in diamond-based magnetometry, as this would permit optimization of the aforementioned figure of merit (FOM). Increased control of the individual parameters also allows a greater degree of material design. For example, linear optical excitation schemes are likely to benefit from higher [NV⁻], whereas side-light-injection and detection methodologies may be more suited to lower [NV⁻] due to the issue of excitation light absorption due to the greatly increased light path-length.

The CVD diamond growth recipes and treatment schemes developed by the present inventors provide this desired flexibility in material design and allow a high FOM to be achieved for a range of nitrogen concentrations as described below.

Two high-[N] CVD diamond recipes (approx. 8 and 25 ppm [N] in the solid) have been developed, which utilize low $^{12}CH_4$ fractions. The resultant single crystal diamond material, when combined with an optimized electron irradiation dose and annealing scheme (e.g. a stepped annealing scheme including steps at 400° C.→800° C.→1000° C.→1200° C.) to reduce the presence of additional parasitic (in terms of $T_2^*/T_2$) defects, leads to range of achievable [NV$^-$] where $T_2^*$ and $T_2$ is constant. The higher (25 ppm [N]) recipe permits a higher $\mathcal{R}$ for a given [NV$^-$] without detrimentally affecting $T_2^*$. A 3 ppm [N] recipe has also been developed. Although significantly different nitrogen concentrations are utilized, it has been found to be possible to achieve a high figure of merit as previously defined for a range of nitrogen concentrations.

The table below shows results from samples produced using several 8 ppm and 25 ppm [N]$_{solid}$ diamond fabrication processes, compared to lower [N] recipes (approximately I ppm [N]$_{solid}$). In the table, "bdl" refers to values below the detection limit of the measurement technique, values in parenthesis refer to the uncertainty in the final significant figure(s), s is the conversion % of starting [N] to [NV]$_{total}$, and $\mathcal{R}$ is the ratio of [NV$^-$] to [NV$^0$]. FOM$_{DC}$ is calculated using equation 3 as previously defined. Examples according to the present invention have an FOM$_{DC}$ value which is at least 2, more preferably at least 3. The other samples represent counter-examples.

negatively charged nitrogen-vacancy defects measured in parts-per-million (ppm) atoms of the single crystal diamond material, [NV$^0$] is a concentration of neutral nitrogen-vacancy defects measured in parts-per-million (ppm) atoms of the single crystal diamond material, and $T_2'$ is a decoherence time of the NV$^-$ defects in microseconds (μs), where $T_2'$ is $T_2^*$ for DC magnetometry or $T_2$ for AC magnetometry. Since concentrations are in ppm and the decoherence time is in μs, then the units for the FOM are ppm$^{1/2}$ms$^{1/2}$.

While it is desirable to achieve a high FOM, a reasonable upper limit for the FOM achievable by using the methodology as described herein is 10, 15, or 20. This contrasts with prior art low nitrogen single crystal diamond samples which have an FOM well below 1. Furthermore, this also contrasts with other higher nitrogen single crystal diamond samples which have not been optimally grown and treated to achieve a high FOM value.

Common features of the diamond fabrication processes which achieve a high FOM include a low fraction of carbon containing gas in the CVD synthesis atmosphere and a relatively high fraction of nitrogen in the CVD synthesis atmosphere (at least compared with prior art processes which use a low nitrogen content), i.e. a relatively high nitrogen to carbon CVD gas synthesis chemistry. A key feature of the methodology is concerned with incorporating a relatively large concentration of nitrogen into the solid diamond lattice while retaining good diamond crystal quality in terms of extended defects and point defects other than the desired nitrogen containing defects and then optimally

| E6 sample ID | Starting [N] est. (ppm) | Rel. irrad. dose | [NV$^0$] (ppm) | [NV$^-$] (ppm) | [NV] (ppm) total | ε (%) | $\mathcal{R}$ | $T_2$ (μs) | $T_2^*$ (μs) | FOM$_{DC}$ |
|---|---|---|---|---|---|---|---|---|---|---|
| 1460413-04 | 1 | 1× | 0.07(1) | 0.012(2) | 0.08(1) | 8(1) | 0.17(4) | 155(15) | 4.2(3) | 0.038(4) |
| 1460413-05 | 1 | 1× | 0.09(1) | 0.022(2) | 0.11(1) | 11(1) | 0.26(4) | | | |
| 1460413-06 | 1 | 2× | 0.10(1) | 0.010(2) | 0.11(1) | 11(1) | 0.10(2) | 90(19) | 3.0(7) | 0.017(4) |
| 1460413-09 | 1 | 3× | 0.13(1) | 0.020(2) | 0.15(1) | 15(1) | 0.15(2) | 66(10) | 2.3(3) | 0.033(4) |
| 1460412-01 | 8.5 | 1× | bdl | 1.7(2) | >1.7(2) | >20(2) | | 1.6(1) | 0.30(5) | |
| 1460412-05 | 8.5 | 2× | 0.20(2) | 1.5(2) | 1.7(2) | 20(2) | 8(1) | 2.2(2) | 0.50(5) | 6.5(6) |
| 1460412-08 | 8.5 | 3× | 1.1(1) | 2.3(2) | 3.4(2) | 40(3) | 2.1(3) | 5.2(1) | 0.50(5) | 2.2(2) |
| 1460412-10 | 8.5 | 1× | 1.1(1) | 2.0(2) | 3.1(2) | 37(3) | 1.8(2) | 10(2) | 0.30(5) | 1.4(1) |
| 1560413-02 | 8.5 | 3× | | | | | | 12.8(3) | 0.4(1) | |
| 1460414-01 | 25 | 1× | 0.22(2) | 1.6(2) | 1.8(2) | 7.3(8) | 7(1) | 1.1(1) | 0.7(1) | 7.7(8) |
| 1460414-02 | 25 | 1× | 0.22(2) | 1.7(2) | 1.9(2) | 7.7(8) | 8(1) | 1.1(1) | 0.4(1) | 6.4(9) |

It can be seen that by combining an optimized diamond growth process with optimized irradiation and annealing techniques it is possible to achieve a high FOM for a range of single crystal diamond materials having different nitrogen concentrations (the highest FOM in the table reaching 7.7).

In light of the above, one aspect of the present invention provides a single crystal diamond material comprising:
neutral nitrogen-vacancy defects (NV$^0$);
negatively charged nitrogen-vacancy defects (NV$^-$); and
single substitutional nitrogen defects (N$_s$) which transfer their charge to the neutral nitrogen-vacancy defects (NV$^0$) to convert them into the negatively charged nitrogen-vacancy defects (NV$^-$),
characterized in that the single crystal diamond material has a magnetometry figure of merit (FOM) of at least 2, more preferably at least 3, wherein the magnetometry figure of merit is defined by $$FOM = \mathcal{R}\sqrt{[NV^-]T_2'}$$

where $\mathcal{R}$ is a ratio of concentrations of negatively charged nitrogen-vacancy defects to neutral nitrogen-vacancy defects ([NV$^-$]/[NV$^0$]), [NV$^-$] is the concentration of treating the material to obtain the desired combination of nitrogen containing defects in terms of N$_s$, NV$^0$, and NV$^-$.

To achieve the high FOM values as previously described it is advantageous that the single crystal diamond material comprises one or more of the following features:
a ratio $\mathcal{R}$ ([NV$^-$]/[NV$^0$]) which is at least 3, 4, 5, 6, or 7, optionally no more than 20, 15 or 10;
a concentration [NV$^-$] which is at least 1.3 ppm, 1.5 ppm, or 1.7 ppm, optionally no more than 10 ppm, 5 ppm, 3 ppm, or 2 ppm;
a $T_2^*$ which is at least 0.4 μs, 0.5 μs, 0.6 s, or 0.7 μs, optionally no more than 5 s, 3 μs, or 1 μs; and
a total nitrogen concentration of at least 3 ppm, 5 ppm, 8 ppm, 12 ppm, 18 ppm, or 25 ppm, optionally no more than 300 ppm, 100 ppm, or 50 ppm.

The aforementioned diamond material characteristics are advantageously provided in a relatively large single crystal diamond (e.g. the single crystal diamond material may have three orthogonal dimensions of at least 0.5 mm, and is optionally in the form of a plate having a thickness of at least 0.5 mm and a lateral size of at least 5 mm). When such a crystal is incorporated into a magnetometer, a light source is utilized to excite the NV⁻ defects in the single crystal diamond and fluorescent light is detected and analysed to determine an external magnetic field as described in the background section. The size of the crystal will affect the number of NV⁻ defects which are utilized and thus will affect the sensitivity of the magnetometer, in addition to the material properties of the diamond. As such, the synthesis process (e.g. a CVD synthesis process) is advantageously capable of achieving the material parameters specified herein for a relatively large crystal. As an alternative, or in addition, to the provision of a large diamond crystal, the path length of excitation within the diamond can be increased by reflecting the excitation beam back and forth through the crystal.

Another possibility is to provide multiple diamond samples to increase the volume of diamond which is interrogated by the excitation beam in a magnetometer. In this regard, it should be appreciated that increasing the volume of a diamond sample will ultimately require an increase in synthesis thickness. This presents a challenge in terms of complexity, yield, and cost. This is particularly the case when using synthesis parameters which are optimized for magnetometer sensitivity rather than tailored to facilitate high crystal quality diamond growth to large thickness.

One solution to increased diamond-sample thickness is to use multiple diamond samples fused together. In this manner a single laser can be used to excite NV⁻ centres throughout the total depth of the combined samples in a magnetometer. One problem with such an approach is that if the diamond samples have any lattice misalignment, then the NV⁻ defects will be misaligned between diamond samples and this can adversely affect contrast and sensitivity of the magnetometer which relies on the orientation of the NV⁻ defects relative to the external magnetic field. However, it has been found that combining two or more diamond samples in this manner has the potential to increase sensitivity without placing unreasonable accuracies in terms of the angular alignment of the two diamond samples as set out below. In particular, it has been found that a small misalignment between two stacked diamonds can be tolerated for magnetometry applications. For example, the misalignment may be no more than 5°, 4°, 3°, 2°, or 1° and this is experimentally achievable.

It may be noted that for a particular application the size of the single crystal diamond and the nitrogen content of the material can be tailored for magnetometry applications. In terms of embodiments of the present invention, a lower nitrogen concentration embodiment may advantageously be provided in a relatively large crystal size whereas a higher nitrogen content embodiment may be provided in a smaller crystal size. Such alternatives can result in the same number of nitrogen-vacancy defects being addressed in use (larger crystals having a lower concentration of nitrogen-vacancy defects but a longer light path result in the same number of defects being optically addresses as for a smaller crystal with a higher defect concentration but a shorter light path).

It should also be noted that the family of nitrogen containing single crystal diamond materials of the present invention may be provided in free-standing form or provided as a portion of a larger single crystal diamond. For example, a single crystal diamond can be fabricating comprising a layer or region of material according to the present invention. The remainder of the crystal may have a different composition, e.g. a high purity diamond lattice. Such a configuration is useful when a high nitrogen content embodiment of the present material is utilized. This is because while such a material can generate a strong fluorescent signal, a portion of the signal is absorbed within the high nitrogen content material leading to loss of sensitivity. By providing a region or layer of such a material in a lower nitrogen content diamond material, absorption of the fluorescent signal within the diamond component can be reduced. The use of a high-purity layer or region combined with the material according to the present invention may actually provide a number of benefits. For example a high-purity region surrounding (in one or more directions) the material according to this invention can be engineered to possess low optical absorption at the emission wavelength of nitrogen-vacancy defects and this may provide benefits in terms of efficiency of nitrogen-vacancy luminescence collection. In addition, the nitrogen-vacancy defect resonance line is also sensitive to temperature. Accordingly, a surrounding mass of diamond offers potential benefits in heat extraction, temperature control and hence sensitivity/accuracy of a magnetic-field measurement.

The single crystal diamond material according to embodiments of the present invention may also comprise a ¹⁵N concentration which is higher than 0.4% (natural isotopic abundance) of a total nitrogen concentration in the single crystal diamond material and/or an ¹⁵NV concentration which is higher than 0.4% of the total NV concentration (¹⁴NV+¹⁵NV). In this regard, each nitrogen-vacancy resonance is split into either two or three frequency-separated lines depending on the nitrogen isotope comprising the NV⁻ defect. ¹⁴N has nuclear-spin I=1 hence three lines, whilst ¹⁵N has I=½ and thus two lines. The isotopic abundance of the nitrogen-dopant used during the synthesis process (and any other nitrogen-containing sources present) determines the balance of nitrogen isotopes present in the material. The use of natural abundance isotope dopants results in 99.6% ¹⁴NV, 0.4% ¹⁵NV. Increasing the fraction of ¹⁵N using isotopically-enriched dopants during the synthesis process permits an increased fraction of the NV defects to have resonance lines which are split into two instead of three. This manifests itself as an increase in contrast ("bright" to "dark" in the optical readout) since the intensity, which is fixed for a given concentration of [NV], is distributed amongst fewer frequency-separated lines. Hence the material according to this invention may be grown with ¹⁵N-enriched gases to provide an increase in sensitivity under certain readout schemes.

EXAMPLES

According to certain examples, the following diamond growth conditions can be utilized:
Microwave power=5 kW
Pressure=230 Torr
Hydrogen Flow Rate=580 standard cubic centimetres per minute (sccm)
Methane Flow Rate=12 sccm
Nitrogen dopant=30 sccm of 1000 ppm $N_2$ in $H_2$ Parameters such as the nitrogen level can be varied according to the desired nitrogen concentration in the final product. Optionally, oxygen can also be added to the growth process. After growth, the single crystal diamond material is treated using an optimized irradiation and annealing process as previously described. While growth of nitrogen containing diamond material followed by irradiation and annealing has been previously disclosed in the art, the difference here is that the growth, irradiation, and annealing steps are optimized according to the Figure of Merit defined herein for magnetometry applications. Product material can then be characterized as follows.

Optical absorption spectroscopy provides a route to quantify the concentration of both charge states of NV. Due to the range of wavelengths probed by the instruments (from UV to visible and sometimes near-infrared) these are often referred to as "UV-VIS-NIR" spectrometers.

For absorption that is not intrinsic to a material, i.e. is introduced via the presence of defects (whether structure or point-impurities), the integrated absorption coefficient across defect's zero-phonon-line (ZPL) can be related to the density of defects giving rise to that ZPL. In the case of NV in diamond these ZPLs occur at 637 nm (1.945 eV) and 575 nm (2.156 eV) for $NV^-$ and $NV^0$, respectively. UV-VIS-NIR spectroscopy (henceforth referred to as UV-Vis) can therefore be used as a quantitative technique, provided the relevant calibration constants, relating the integrated absorption under the ZPL to defect density, are known. Knowledge of these constants comes from previous academic work on the fundamentals of defect spectroscopy in diamond, see for example G Davies, "Current problems in diamond: towards a quantitative understanding", Physica B 273-274 (1999) 15-23.

In the paper of G Davies the integrated absorption (ℑ) under the NV ZPL is written as:

$$\mathfrak{I}_{NV} = (1.40 \pm 0.35) \times 10^{-16} [NV]$$

where ℑ is in units of $meVcm^{-1}$ and [NV] is a defect density in $cm^{-3}$. The concentration of NV (both charge states) in parts per million (ppm) carbon atoms can then be calculated using the knowledge of the carbon lattice atomic spacing in diamond; a defect density of $1.76 \times 10^{17}$ $cm^{-3}$ has a concentration of 1 ppm.

The temperature of the sample during a UV-Vis absorption measurement strongly influences the form of the absorption spectrum. Due to a defect's interaction with the lattice via phonons in diamond, each characteristic absorption peak (ZPL) in diamond has an associated vibronic sideband. In addition the ZPL linewidth increases with increasing temperature and may then overlap with the defect's vibronic sideband (or other nearby features). Since lowering the temperature reduce the linewidth of the ZPL, reduced-temperature measurements also increase the visibility of the absorption peak relative to background noise. For this reason defect concentrations (and their associated calibration factors) are determined by placing samples within a cryostat operating at liquid N temperatures, i.e. at or just above 77 K.

Post annealing of a sample (>500° C.) the ratio of $[NV^0]$ of $[NV^-]$ may be increased due to thermally-induced charge transfer (see R Khan et al., "Charge transfer effects, thermo- and photochromism in single crystal CVD synthetic diamond", Journal of Physics: Condensed Matter, 21 (2009) 364214), provided the sample is not subsequently exposed to UV (<300 nm) range of wavelengths. For a standardized means of measuring the concentrations of $NV^-$ and $NV^0$ samples each of the faces of the sample have therefore been exposed to UV by means of a 254 nm lamp (4 W) for a period of 10 minutes per face. This minimizes ℛ prior to characterization and this metric is then stable if the sample is left under ambient temperature (<100° C.) and room/natural lighting conditions. $[NV^-]$, $[NV^0]$, and hence ℛ, are then measured by 77 K UV-Vis and calculated, via numerical integration or Voigt-lineshape fitting, the areas under the $NV^0$ and $NV^-$ ZPLs and using the previous equation after suitable baseline (background) subtraction.

Values for $T_2^*$ have been determined via a Ramsey pulse sequence. The simplest on-resonance decay in the NV luminescence (free-induction-decay or "FID") would be single exponential with the desired characteristic decay time $T_2^*$. However, in order to improve the visibility of the decay from the background noise it is typical to detune the microwave frequency slightly away from the resonant NV frequency (the line position as observed in an ODMR frequency scan). This introduces additional oscillations which are more easily discriminated from the shot-noise background. However for NV, depending on the chosen RF power level, multiple resonance lines for a single NV– defect (or a group of commonly-aligned NV– defects) may be observed, due to the $^{14}N$ hyperfine interaction ($^{14}N$ has nuclear spin 1).

The experimentally observed FID is therefore commonly fitted to a decay given by the following expression:

$$I = \exp[-(\tau/T_2^*)^c] \Sigma_{m=-1}^{m=+1} \beta_m \cos[2\pi(\delta + mA_N)\tau]$$

where τ is the free procession time interval, c is a factor to permit the quality of the fit to be improved (ε=1.0 is ideal), $\beta_m$ is the weighting of each hyperfine contribution ($\beta_{1,2,3} = 1/3$ is ideal) and δ is the detuning away from the central NV line position.

By least-squares fitting the determined FID curve to the expression in the above equation, the optimum value of $T_2^*$ can be determined. This is taken to be the $NV^-$ $T_2^*$ value, with an uncertainty defined by the quality of fit.

Using a comparable experimental setup $T_2$ has been determined by means of a Hahn-Echo experiment, well known to those who are skilled in the art.

Figure 2:
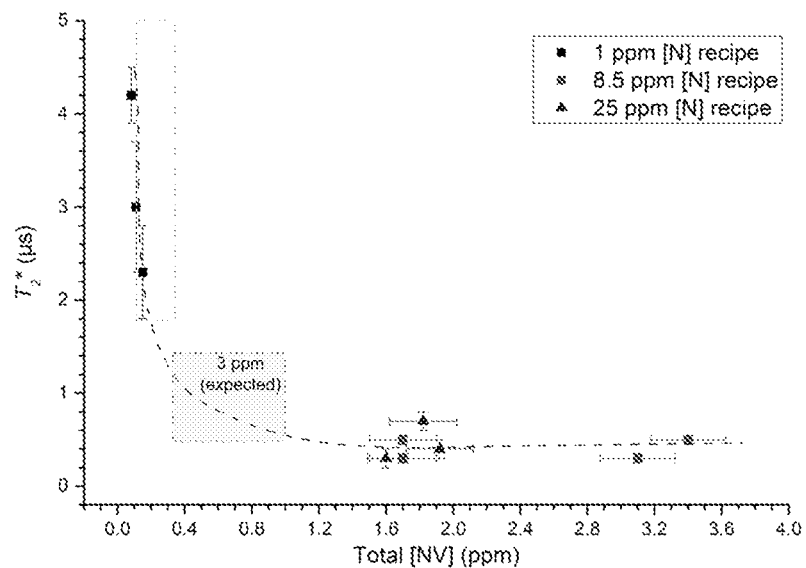
FIG. 2 is a graph of decoherence time $T_2^*$ as a function of total [NV] for a range of single crystal diamond materials.

Plots of $T_2^*$ and $T_2$ as a function of [NV] are shown in FIGS. 1 and 2. FIG. 1 shows a collation of data from the previous table displaying $T_2$ (Hahn Echo) as a function of total [NV] for three different CVD recipes (1 ppm, 8.5 ppm, and 25 ppm). The expected position for a 3 ppm recipe is also illustrated. FIG. 2 also shows a collation of data from the previous table displaying $T_2^*$ as a function of total [NV] for the three different CVD recipes. Again, the expected position for a 3 ppm recipe is also illustrated.

FIGS. 1 and 2 illustrate how $T_2$ and $T_2^*$ are relatively constant across the range [NV]>1.2 ppm. This could be interpreted as the dephasing times being largely dominated by residual [N] (see paper by Acosta et al., Phys. Rev. B 80, 115202). However, the data presented here also illustrates that the higher nitrogen content CVD recipes, which will generally have higher residual [N], yields material with comparable $T_2$ and $T_2^*$ irradiation and annealing. Furthermore, in this material the ratio of $[NV^-]/[NV^0]$ (i.e. ℛ) is increased, hence this material presents beneficial properties for use in magnetometry applications. It is perhaps surprising that $T_2$ and $T_2^*$ are relatively constant across the range [NV]>1.2 ppm despite the fact that both NV concentration and residual nitrogen in the material is increasing. However, it should also be noted that these results have been achieved by using a growth process which is capable of retaining good diamond crystal quality up to high nitrogen concentrations (in terms of extended defects and point defects other than the desired nitrogen containing defects), this being combined with optimized irradiation and annealing treatments. As such, it has been found that using this methodology it is possible to decouple $T_2$ and $T_2^*$ from the nitrogen content of the material to a large extent, at least at [NV]>1.2 ppm. This is important as for many magnetometry applications it would be advantageous to have both a high nitrogen content and a high $NV^-$ decoherence time (magnetic field sensitivity being increased by increasing the sensitivity of each individual $NV^-$ as well as by increasing the number of $NV^-$). In contrast, to date it was generally been assumed that NV⁻ decoherence times would steadily decrease with increasing nitrogen (and NV⁻) content.

Figure 3:
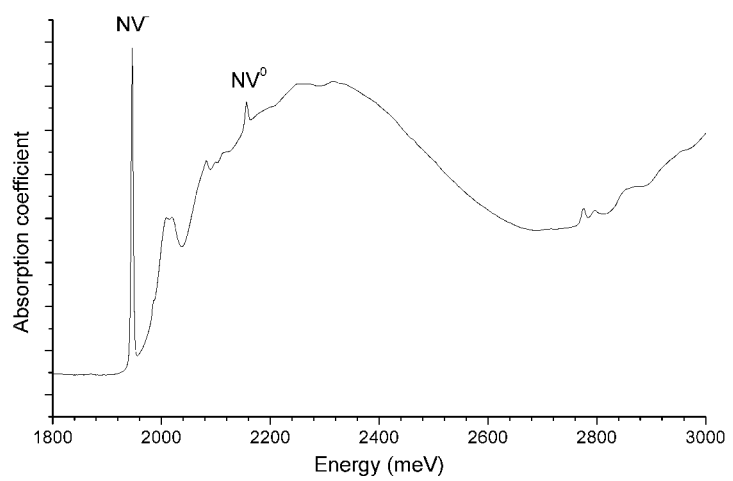
FIG. 3 is a UV-Visible spectrum for a single crystal diamond sample illustrating a high ratio of [NV⁻]/[NV]⁰.

FIG. 3 shows a UV-Vis spectrum for a diamond sample comprising 8.5 ppm [N] with a 30% conversion to NV, recorded at 77 K, illustrating the high ratio of $[NV^-]/[NV]^0$. As such, together with FIGS. 1 and 2, it is evident that it is possible to provide a diamond material which has a combination of a high $[NV^-]/[NV]^0$ ratio, a high overall $[NV^-]$, and also retain a high $T_2'$ (where $T_2'$ is $T_2^*$ for DC magnetometry and $T_2$ for AC magnetometry).

The family of optimized nitrogen containing single crystal diamond materials as described herein is capable of providing higher sensitivity magnetometry and more controllable magnetometry material-based properties. It will also be appreciated that while the materials described herein have been optimized for magnetometry applications, the materials are also suitable for other applications which utilize negatively charged nitrogen-vacancy defects within the diamond lattice. Furthermore, while the invention has been particularly shown and described with reference to embodiments, it will be understood to those skilled in the art that various changes in form and detail may be made without departing from the scope of the invention which is defined by the appending claims.

The invention claimed is:

1. A single crystal diamond material comprising:
neutral nitrogen-vacancy defects (NV⁰);
negatively charged nitrogen-vacancy defects (NV⁻); and
single substitutional nitrogen defects ($N_s$) which transfer their charge to the neutral nitrogen-vacancy defects (NV⁰) to convert them into the negatively charged nitrogen-vacancy defects (NV⁻),
characterized in that the single crystal diamond material has a magnetometry figure of merit (FOM) of at least 2, wherein the magnetometry figure of merit is defined by $$FOM = \mathcal{R}\sqrt{[NV^-] \times T_2'}$$

where $\mathcal{R}$ is a ratio of concentrations of negatively charged nitrogen-vacancy defects to neutral nitrogen-vacancy defects ($[NV^-]/[NV^0]$), $[NV^-]$ is the concentration of negatively charged nitrogen-vacancy defects measured in parts-per-million (ppm) atoms of the single crystal diamond material, $[NV^0]$ is a concentration of neutral nitrogen-vacancy defects measured in parts-per-million (ppm) atoms of the single crystal diamond material, and $T_2'$ is a decoherence time of the NV⁻ defects in microseconds, where $T_2'$ is $T_2^*$ for DC magnetometry or $T_2$ for AC magnetometry.

2. A single crystal diamond material according to claim 1, wherein the FOM is selected from any of at least 3, at least 4, at least 5, at least 6 and at least 7.

3. A single crystal diamond material according to claim 1, wherein R is selected from any of at least 4, at least 5, at least 6, and at least 7.

4. A single crystal diamond material according to claim 1, wherein $[NV^-]$ is selected from any of at least 1.3 ppm, at least 1.5 ppm and at least 1.7 ppm.

5. A single crystal diamond material according to claim 1, wherein $T_2^*$ is selected from any of at least 0.4 µs, at least 0.5 µs, at least 0.6 µs and at least 0.7 µs.

6. A single crystal diamond material according to claim 1, wherein the single crystal diamond material has a total nitrogen concentration selected from any of at least 3 ppm, at least 5 ppm, at least 8 ppm, at least 12 ppm, at least 18 ppm and at least 25 ppm.

7. A single crystal diamond material according to claim 1, wherein the single crystal diamond material is single crystal CVD diamond.

8. A single crystal diamond material according to claim 1, wherein the single crystal diamond material has three orthogonal dimensions of at least 0.5 mm.

9. A single crystal diamond material according to claim 1, wherein the single crystal diamond material has a ¹⁵N concentration which is higher than 0.4% of a total nitrogen concentration in the single crystal diamond material and/or an ¹⁵NV concentration which is higher than 0.4% of a total NV concentration given by ¹⁴NV+¹⁵NV.

* * * * *